United States Patent
Kang (10) Patent No.: US 6,922,352 B2
(45) Date of Patent: Jul. 26, 2005

(54) FERAM HAVING TEST CIRCUIT AND METHOD FOR TESTING THE SAME

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 14 days.

(21) Appl. No.: 10/740,891

(22) Filed: Dec. 22, 2003

(65) Prior Publication Data
US 2005/0047190 A1 Mar. 3, 2005

(30) Foreign Application Priority Data
Aug. 27, 2003 (KR) .................. 10-2003-0059567

(51) Int. Cl.⁷ .............................................. G11C 11/22
(52) U.S. Cl. ...................................... 365/145; 365/201
(58) Field of Search .................................. 365/145, 201

(56) References Cited

U.S. PATENT DOCUMENTS 5,751,628 A * 5/1998 Hirano et al. ............... 365/145
6,680,861 B2 * 1/2004 Kasai ......................... 365/145

* cited by examiner

Primary Examiner—Michael Tran
(74) Attorney, Agent, or Firm—Heller Ehrman LLP (57) ABSTRACT

A nonvolatile ferroelectric memory device comprising a cell array having a multi-bitline structure comprises a plurality of cell array blocks, common data buses shared by the plurality of cell array blocks to transmit data stored in the cell array blocks, a sense amplifier array which compares a sensing voltage of the data transmitted through the common data buses with a reference voltage, a reference voltage controller which adjusts the reference voltage in response to test mode control signal externally applied thereto, and a column selecting controller which selects the predetermined number of cell array blocks in response to the test mode control signals and outputs sensing voltages of the selected cell array blocks to the common data buses at the same time. Accordingly, the nonvolatile ferroelectric memory device can selectively test more than two cell array blocks as well as a single cell array block having a 1T1C structure simultaneously by using just control signals without additionally modifying an internal circuit.

9 Claims, 12 Drawing Sheets

| MODE | TM1 | TM2 | TEST OPERATION |
|---|---|---|---|
| A | 0 | 0 | 1T1C TEST (1BLOCK SELECTION) |
| B | 0 | 1 | 2T2C TEST (2BLOCK SELECTION) |
| C | 1 | 0 | 4T4C TEST (4BLOCK SELECTION) |
| D | 1 | 1 | 8T8C TEST (8BLOCK SELECTION) |

FERAM HAVING TEST CIRCUIT AND METHOD FOR TESTING THE SAME

BACKGROUND OF THE INVENTION

1. Field of the Invention

The present invention relates to a nonvolatile ferroelectric memory device, and more specifically, to a nonvolatile ferroelectric memory device having a test circuit which can selectively test more than 2 cell array blocks at the same time without modifying an internal circuit.

2. Description of the Prior Art

Generally, a ferroelectric random access memory (FeRAM) has the data processing speed as fast as a Dynamic Random Access Memory (DRAM), and also retains data even in a power-off state. For this reason, the nonvolatile ferroelectric memory has attracted considerable attention as a next generation memory device.

The FeRAM has a structure similar to DRAM, and employs ferroelectric material for a capacitor to use a high residual polarization characteristic of the FeRAM. The residual polarization characteristic protects data from erasing even when electric field is removed.

Figure 1:
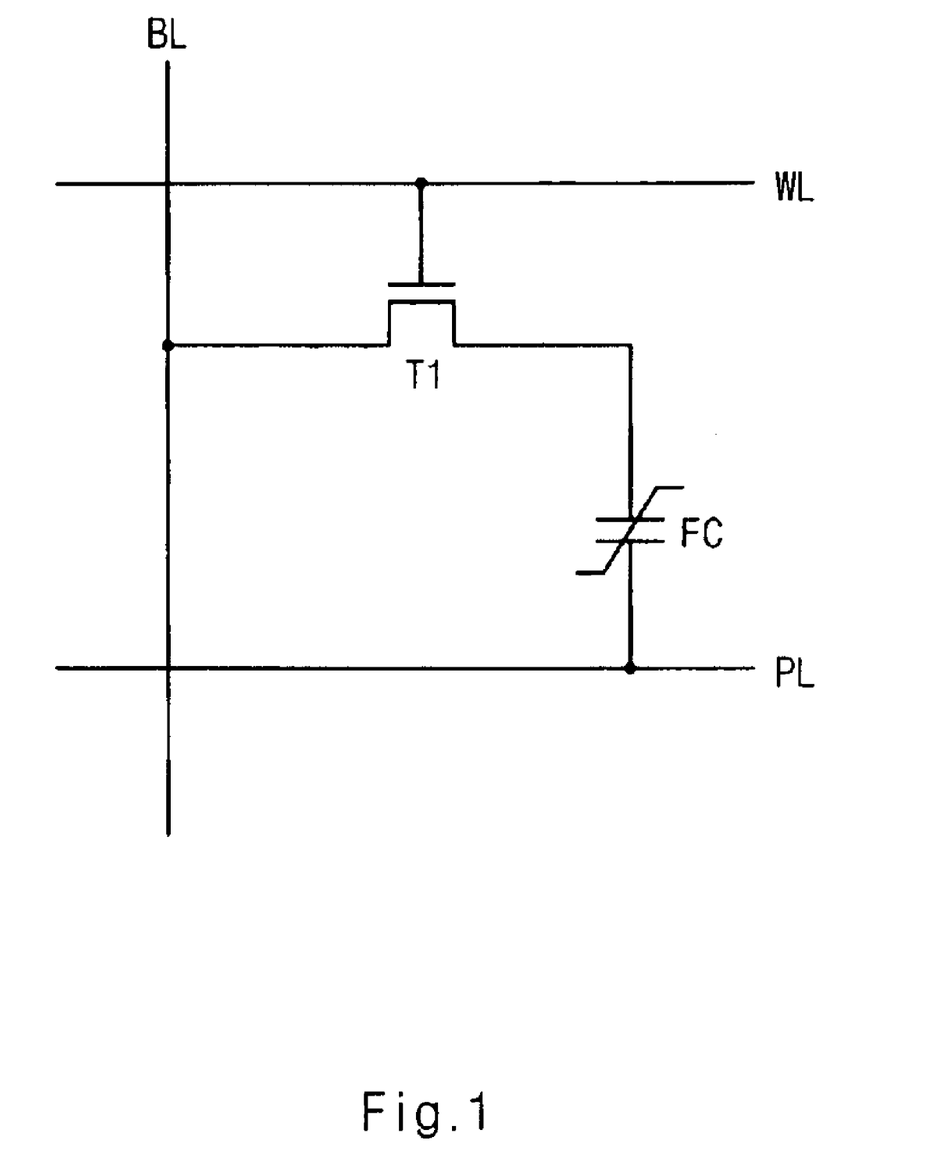
FIG. 1 is a circuit diagram illustrating a memory cell of the conventional ferroelectric memory device.

FIG. 1 illustrates a unit memory cell of a conventional nonvolatile memory device.

The unit memory cell of the conventional FRAM is provided with a bitline BL arranged in one direction, a wordline WL arranged perpendicular to the bitline and a plateline PL arranged in parallel to the wordline and spaced at a predetermined interval. The unit memory cell is also provided with a transistor T1 having a gate connected to an adjacent wordline WL and a source connected to an adjacent bitline BL, and a ferroelectric capacitor FC having two electrodes respectively connected to an electrode of the NMOS transistor T1 and the plateline PL.

Figure 2:
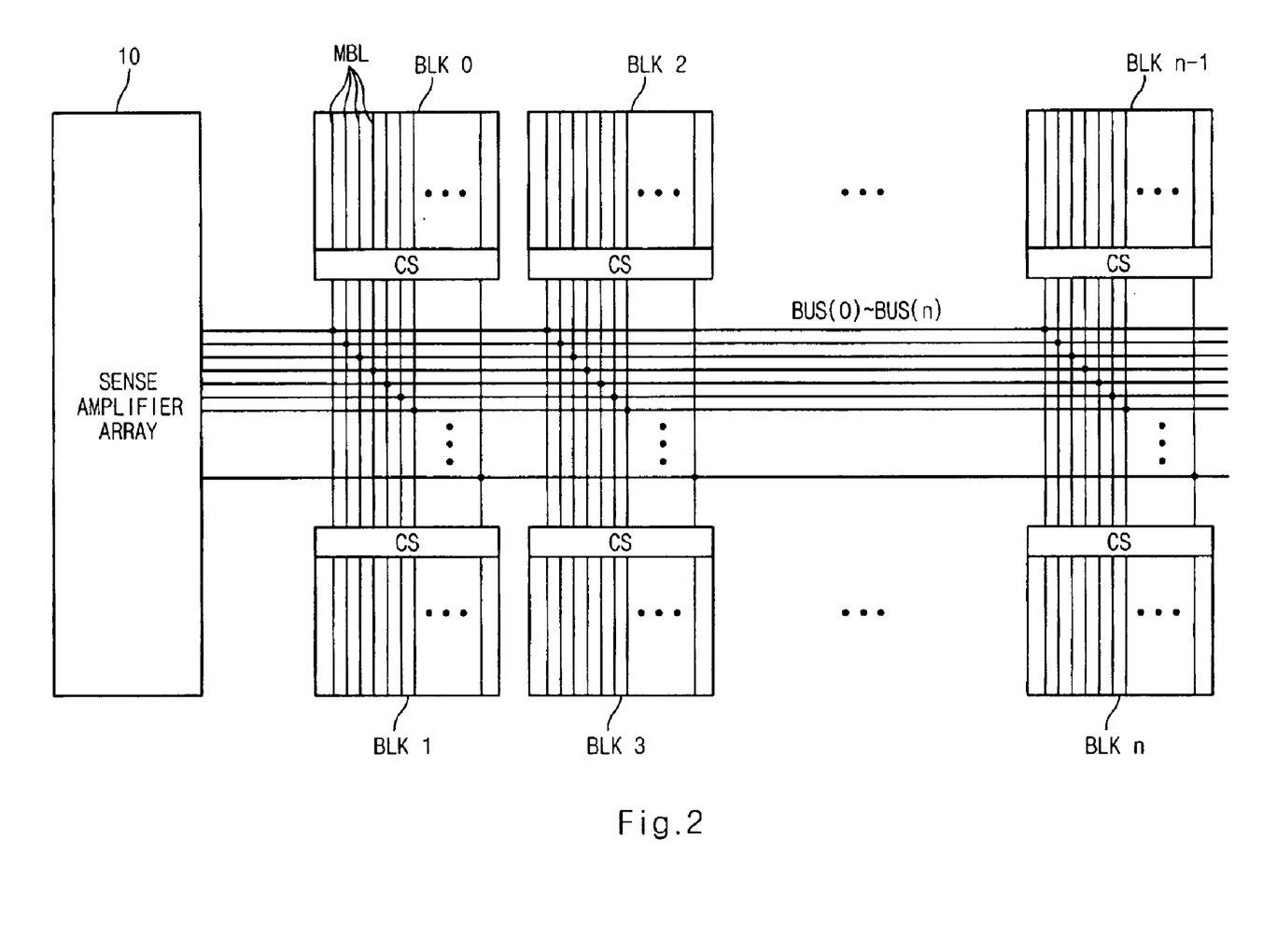
FIG. 2 is a block diagram illustrating the configuration of the conventional ferroelectric memory device.

FIG. 2 is a block diagram illustrating the configuration of cell array of a nonvolatile ferroelectric memory.

Cell array blocks BLK0~BLKn are symmetrically located above and below common data buses BUS(0)~BUS(n), and each main bitline MBL of the cell array blocks BLK0~BLKn is selectively connected with the data buses BUS(0)~BUS(n) by a column selecting unit CS. The cell array blocks BLK0~BLKn have a multi-bitline structure, each main bitline comprising a plurality of sub bitlines (not shown). The sensing voltage of the sub bitlines is converted to the electric current to induce the sensing voltage of the main bitline MBL. The induced sensing voltage of the main bitline MBL is transmitted to a corresponding sense amplifier of a sense amplifier array 10 through the data buses BUS(0)~BUS(n) and then sensed. Each of the common data buses BUS(0)~BUS(n) is connected with one main bitline MBL of each cell array block BLK(0)~BLK(n).

Figure 3:
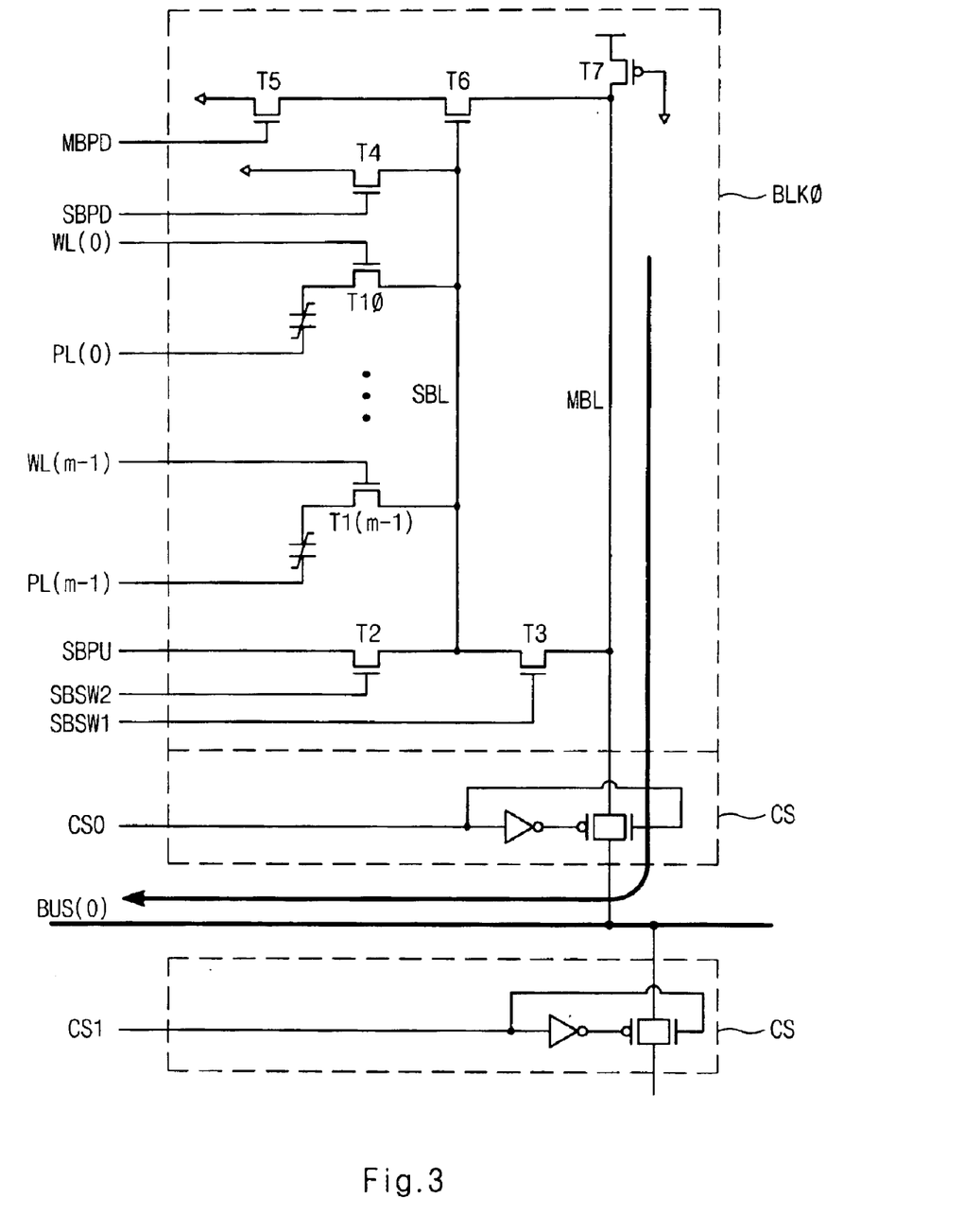
FIG. 3 is a circuit diagram illustrating the configuration of the cell array block and column selecting unit of FIG. 2.

FIG. 3 is a circuit diagram illustrating the configuration of the cell array block BLK0 having a multi-bitline structure and the column selecting unit CS of FIG. 2.

The sub bitlines SBL are connected to a plurality of memory cells having a 1T1C (1 Transistor 1 Capacitor) structure connected between wordlines WL(0)~WL(m-1) and platelines PL(0)~PL(m-1). The sub bitlines SBL transmit data loaded on itself to a main bitline MBL by activating a sub bitline selecting signal SBSW1 and then turning on a NMOS transistor T3. Accordingly, a main bitline MBL is connected to one sub bitline at a time. Also, a sub bitline SBL is controlled to become a ground voltage level when a sub bitline pull-down signal SBPD is activated to turn on a NMOS transistor T4.

A sub bitline pull-up signal SBPU is a control signal for controlling a power supply supplied to a sub bitline SBL, and a sub bitline selecting signal SBSW2 controls the flow of signals between the sub bitline pull-up signal SBPU and a sub bitline SBL.

The main bitline MBL is selectively connected to a common data bus BUS(0) by the column selecting unit CS which is turned on/off depending on a column selecting signal CS0.

Figure 4:
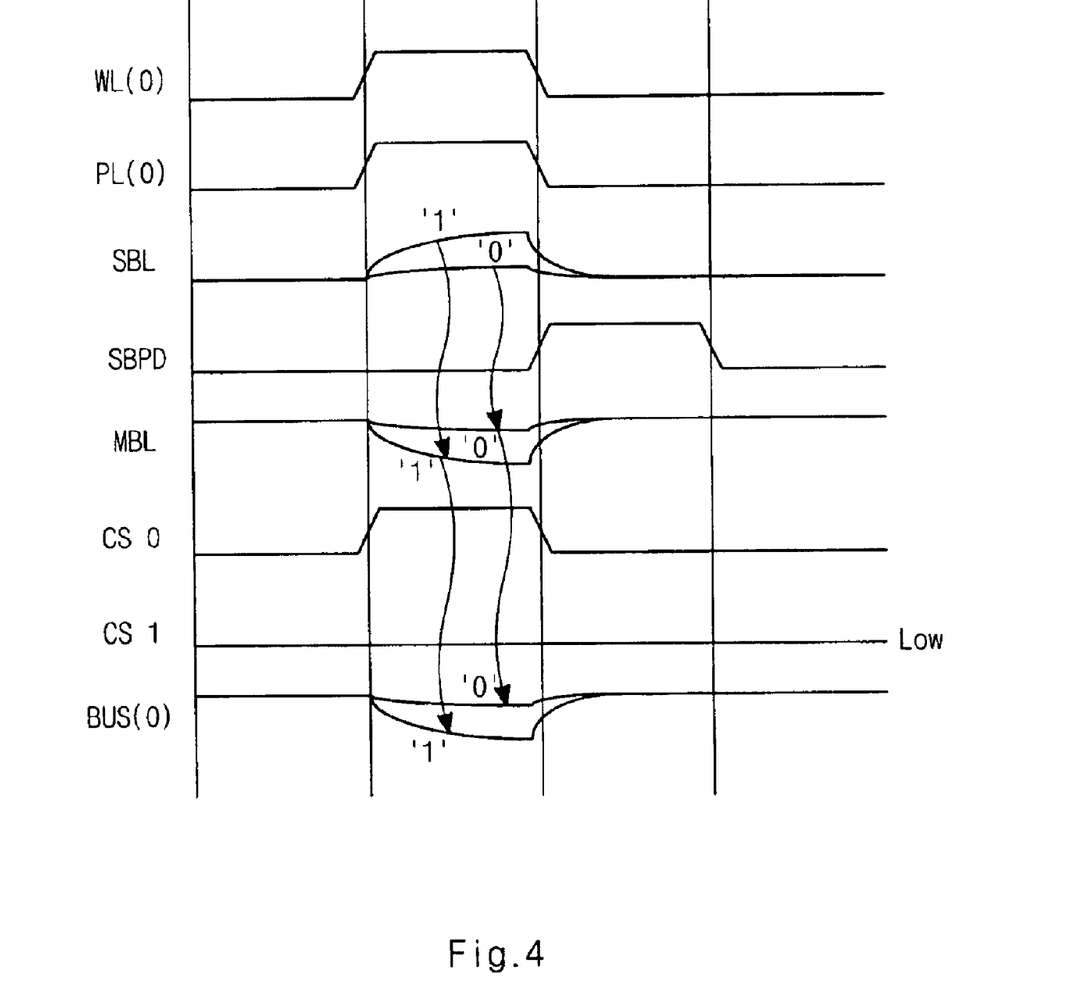
FIG. 4 is a timing diagram illustrating the operation of FIG. 3.

FIG. 4 is a timing diagram explaining the operation of FIG. 3.

When a wordline WL(0) and a plate line PL(0) is activated to a high level, the voltage levels of sub bitline SBL and main bitline MBL are determined according to the data value of the relevant memory cell. For examples, when cell data is "HIGH", the voltage level of sub bitline BL goes up much, and thereby the amount of current flowing through a NMOS transistor T6 is increased much so that the voltage level of main bitline falls much. On the contrary, when cell data is "LOW", the voltage level of sub bitline SBL goes up a little, and thereby the amount of current flowing through the NMOS transistor T6 is reduced so that the voltage level of main bitline MBL falls a little. That is to say, the difference of voltage level in a main bitline MBL is due to cell data.

As shown above, as a result of testing a standard cell having a 1T1C structure, when fail is occurred in some cell array blocks, they are repaired to be used. Particularly, when fail is occurred per a cell array block, failed cell array blocks and normal cell array blocks are combined to be used as 2T2C, 4T4C or 8T8C structure. For examples, when a cell array block BLK0 is failed, it is combined with a normal cell array block BLK1 symmetrically located around the central common data buses BUS(0)~BUS(n) to be used as 4T4C structure, or it is combined with normal cell array blocks BLK1–BLK7 to be repaired as 8T8C structure.

However, as shown above, an additional process for modifying an internal circuit is required to test the operation of repaired memory device after repairing it as 2T2C, 4T4C or 8T8C structure. Accordingly, additional costs and time are required for performing this process.

SUMMARY OF THE INVENTION

Accordingly, it is an object of the present invention to selectively test more than two cell array blocks at the same time as well as a single cell array block having a 1T1C structure by using a control signal without modifying circuitry.

In an embodiment, a nonvolatile ferroelectric memory device comprises:

a plurality of cell array blocks including a plurality of cell arrays having a multi-bitline structure which comprises a plurality of sub bitlines selectively connected to a main bitline and converts a sensing voltage of the sub bitlines to electric current to induce a sensing voltage in the main bitline;

a plurality of common data buses for transmitting a sensing voltage of data stored in the cell array blocks, being shared by the plurality of cell array blocks;

a sense amplifier array having a plurality of sense amplifiers for comparing the sensing voltage transmitted through the common data buses with a reference voltage;

a reference voltage controller for adjusting the reference voltage in response to test mode control signals externally applied thereto; and a column selecting controller for selecting a predetermined number of the cell array blocks in response to the test mode control signals, and outputting sensing voltages of the selected cell array blocks to the common data buses at the same time.

In an embodiment, a method for testing cell array blocks by sensing sensing voltages of a plurality of cell array blocks having a multi-bitline structure which converts sensing voltages of sub bitlines to electric current to induce sensing voltages of main bitlines through common data buses, comprising steps of:

a first test for comparing a sensing voltage of each of the cell array blocks with a reference voltage to judge whether fail is occurred; and a second test, when a cell array block is failed in the first test, for selecting the failed cell array block and at least one normal cell array block at the same time, and then comparing a transmitted sensing voltage with the reference voltage to judge whether fail is occurred.

DETAILED DESCRIPTION OF PREFERRED EMBODIMENTS

The present invention will be described in detail with reference to the accompanying drawings.

Figure 5:
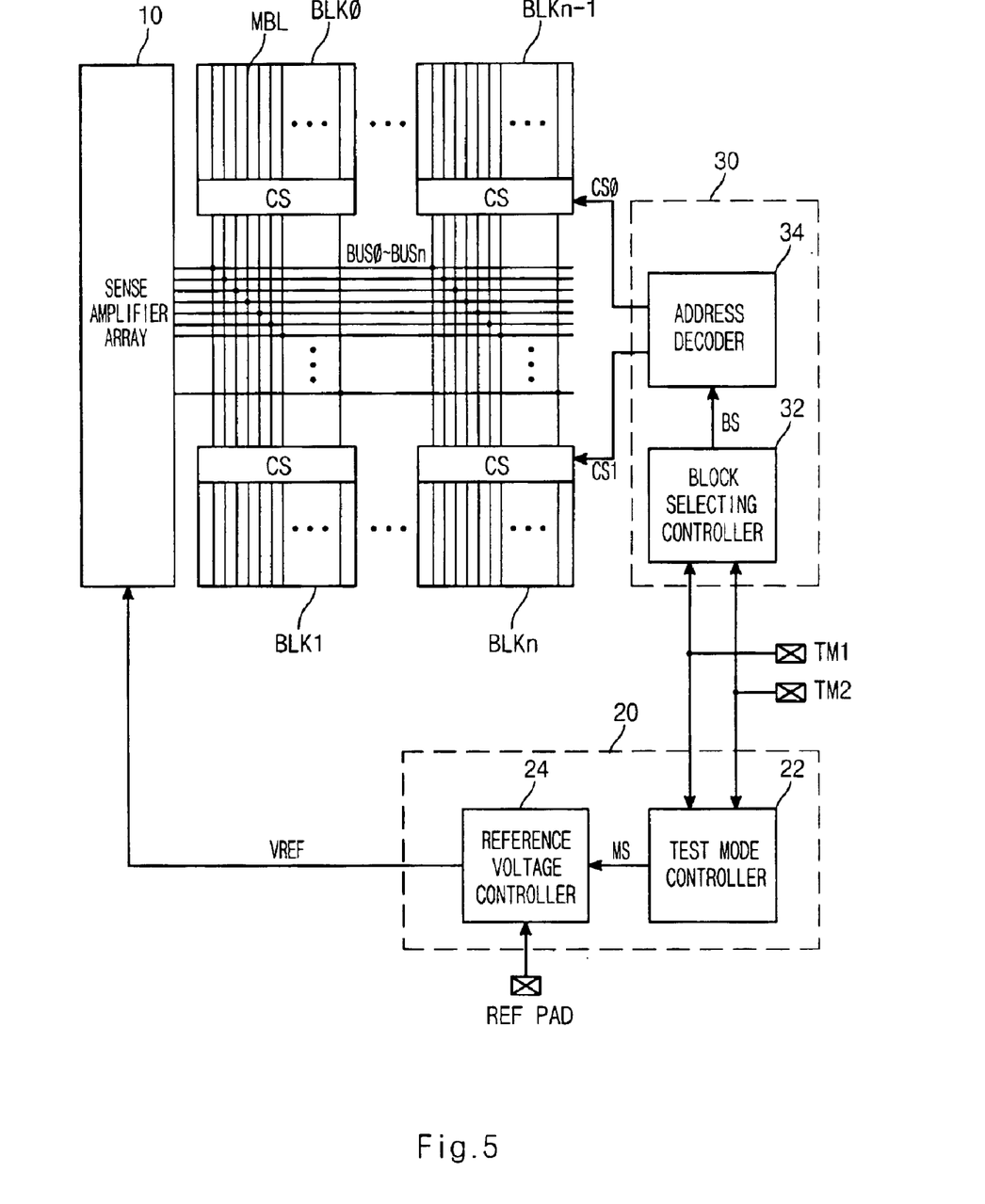
FIG. 5 is a block diagram illustrating the configuration of the nonvolatile ferroelectric memory device having a test circuit according to the present invention.

FIG. 5 is a block diagram illustrating the configuration of the nonvolatile ferroelectric memory device having a test circuit of the present invention.

The nonvolatile ferroelectric memory device comprises cell array blocks BLK0~BLKn, common data buses BUS(0)~BUS(n), a sense amplifier array 10, a column selecting controller 20 and a reference voltage controller 30.

The cell array blocks BLK0~BLKn comprises a plurality of sub cell arrays for storing data, and are symmetrically located above and below common data buses BUS(0)~BUS(n). Each of cell array blocks BLK0~BLKn has a multi-bitline structure. Here, in the multi-bitline structure, a main bitline MBL has a plurality of sub bitlines SBL and a sensing voltage of the main bitline MBL is induced by converting sensing voltages of sub bitlines SBL to electric current. The main bitlines of the cell array blocks BLK0~BLKn are selectively connected with data buses BUS(0)~BUS(n) by a column selecting unit CS. The column selecting unit CS is selectively turned on/off in response to an output signal from the column selecting controller 30.

The common data buses BUS(0)~BUS(n) are selectively connected to the main bitline MBL of each cell array block BLK0~BLKn to transmit data from the main bitline MBL to the sense amplifier array 10.

The sense amplifier array 10 judges the fail of each memory cell by comparing data transmitted through the common data buses BUS(0)~BUS(n) with a reference voltage VREF supplied from the reference voltage controller 20.

The reference voltage controller 20 controls a reference voltage VREF supplied through a reference pad REFPAD to be within a sensing margin of each test mode according to test mode control signals TM1 and TM2.

The reference voltage controller 20 comprises a test mode controller 22 and a reference voltage controller 24. The test mode controller 22 outputs a mode selecting signal MS for controlling the amplitude of the reference voltage VREF according to test mode control signals TM1 and TM2. The reference voltage controller 24 controls the reference voltage VREF supplied through the reference pad REFPAD to be within the predetermined amplitude corresponding to each test mode according to the mode selecting signal MS.

The column selecting controller 30 selects at least one cell array block BLK0~BLKn to be tested at the same time according to the test mode control signals TM1 and TM2, and controls a corresponding column selecting unit CS to connect main bitlines MBL of selected cell array blocks BLK0~BLKn with the common data buses BUS(0)~BUS(n) at the same time.

The column selecting controller 30 comprises a block selecting controller 32 and an address decoder 34. The block selecting controller 32 is connected to the common data buses BUS(0)~BUS(n) in response to the test mode control signals TM1 and TM2 to output a block selecting signal BS for selecting cell array blocks BLK0~BLKn to be tested. The address decoder 34 controls column selecting unit CS of the selected cell array blocks BLK0~BLKn in response to the block selecting signal BS to connect corresponding main bitlines MBL with the common data buses BUS(0)~BUS(n) at the same time.

Figure 6:
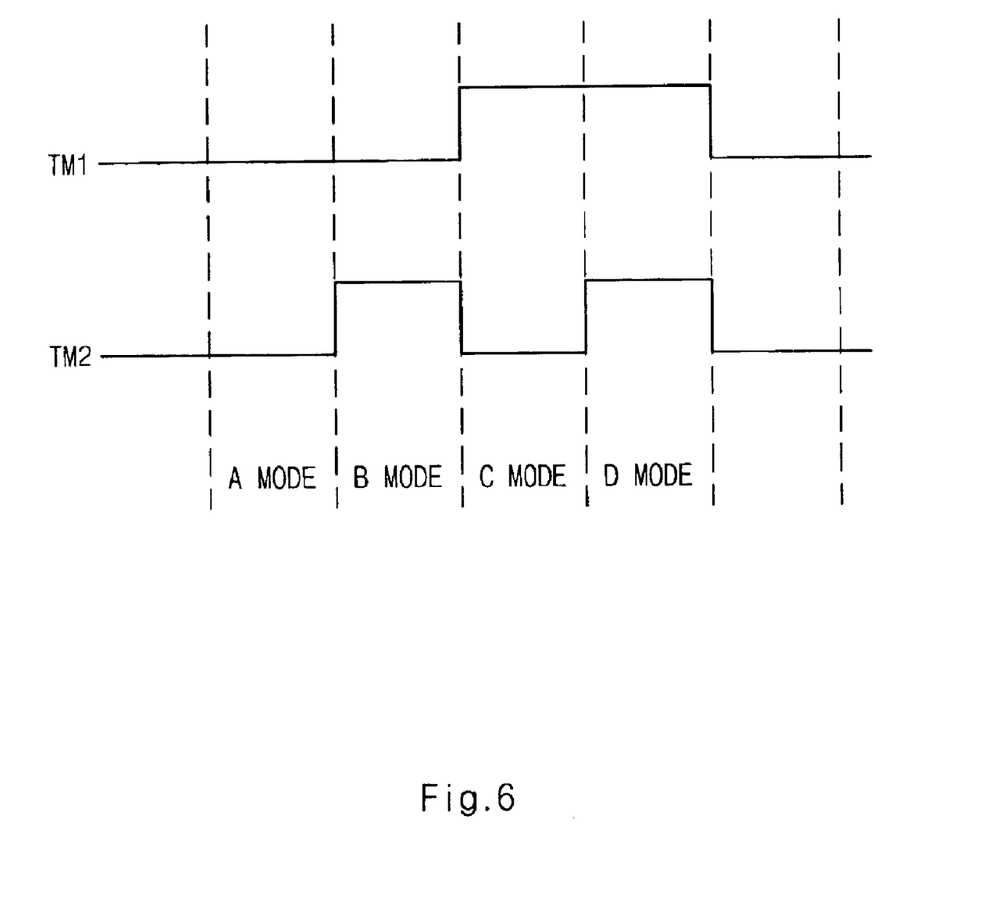
FIG. 6 is a timing diagram illustrating the waveform of test mode control signals in each test mode.

FIG. 6 is a timing diagram illustrating a waveform of the test mode control signals TM1 and TM2 in each test mode, wherein the test mode control signals TM1 and TM2 of 2 bits are used for selectively performing 4 test operations (mode A~mode D).

First, test mode A is set when the test mode control signals TM1 and TM2 become '0' and '0', respectively. At this time, a 1T1C operation is performed for a cell array block. That is to say, when the test mode control signals TM1 and TM2 become '0' and '0' respectively, the column selecting controller 30 turns on a corresponding column selecting unit CS per one cell array block. Accordingly, the common data buses BUS(0)~Bus(n) are connected to only main bitlines of one cell array block BLK0~BLKn. As a result, each of the common data buses BUS(0)~BUS(n) receives a sensing voltages by memory cells having a 1T1C structure.

Test mode B is set when the test mode control signals TM1 and TM2 become '0' and '1', respectively. At this time, a 2T2C operation is performed for two cell array blocks [BLK0–BLK1], [BLK2, BLK3], . . . symmetrically located around the central common data buses BUS(0)~BUS(n). That is, when the test mode control signals TM1 and TM2 become '0' and '1', respectively, the column selecting controller 30 turns on corresponding column selecting units CS at the same time per two cell array blocks [BLK0–BLK1], [BLK2, BLK3], . . . symmetrically located around the central common data buses BUS(0)~BUS(n).

That is, main bitlines MBL of two selected cell array blocks [BLK0–BLK1], [BLK2, BLK3], . . . are simultaneously connected to the common data buses BUS(0)~BUS(n). Therefore, each of the common data buses BUS(0)~BUS(n) receives a sensing voltage by a memory cell having two 1T1Cs, that is, a 2T2C structure.

Test mode C is set when the test mode control signals TM1 and TM2 become '1' and '0', respectively. At this time, a 4T4C test operation is performed for four cell array blocks [BLK0–BLK3], [BLK4–BLK7], . . . symmetrically located around the central common data buses BUS(0)–-BUS(n). That is, when the test mode control signal TM1 and TM2 becomes '1' and '0', respectively, the column selecting controller 30 turns on corresponding column selectors CS at the same time per four cell array blocks [BLK0–BLK3], [BLK4–BLK7], . . . symmetrically located around the central common data buses BUS(0)~BUS(n). Accordingly, main bitlines MBL of 4 selected cell array blocks [BLK0–BLK3], [BLK4–BLK7], . . . are simultaneously connected to the common data buses BUS(0)~BUS(n). As a result, each of the common data buses BUS(0)~BUS(n) receives a sensing voltage by a memory cell having four 1T1Cs, that is, a 4T4C structure.

Lastly, test mode D is set when the test mode control signals TM1 and TM2 become '1' and '1', respectively. At this time, a 8T8C test operation is performed for eight cell array blocks [BLK0–BLK7], [BLK8–BLK15], . . . symmetrically located around the central common data buses BUS(0)~BUS(n). That is, when the test mode control signals TM1 and TM2 becomes '1' and '1' respectively, the column selecting controller 30 turns on corresponding column selectors CS at the same time per eight cell array blocks symmetrically located around the central common data buses BUS(0)~BUS(n). Accordingly, main bitlines MBL of eight selected cell array blocks blocks [BLK0–BLK7], [BLK8–BLK15], . . . are simultaneously connected to the common data buses BUS(0)~BUS(n). As a result, each of the common data buses BUS(0)~BUS(n) receives a sensing voltage by a memory cell having eight 1T1Cs, that is, a 8T8C structure.

Figure 7:
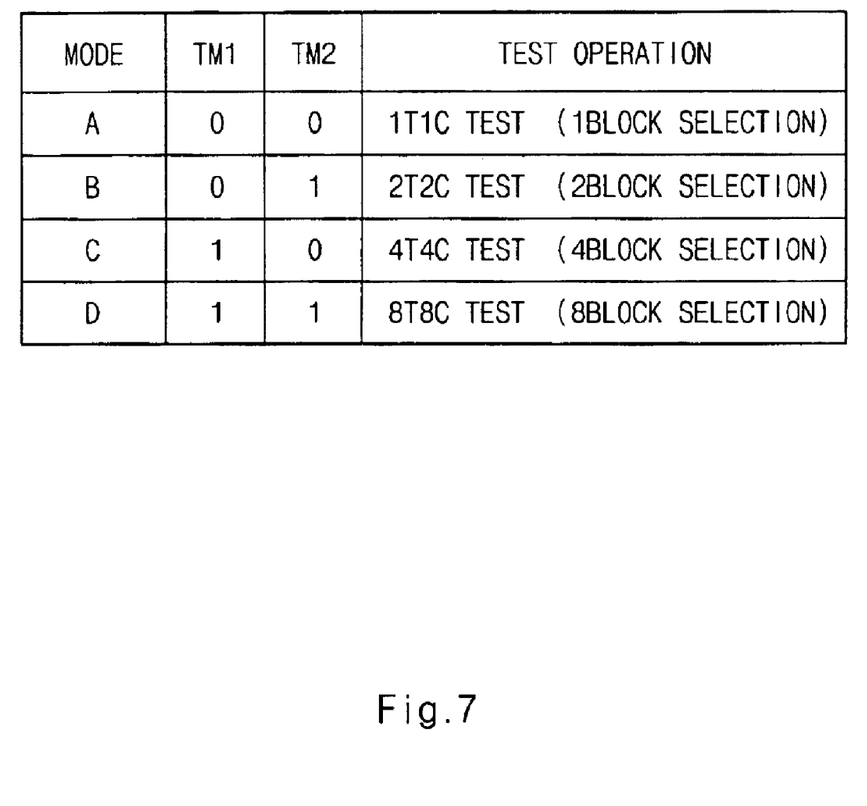
FIG. 7 is a table showing the characteristics of the operation in each test mode.

FIG. 7 is a table showing the characteristics of the operation according to each test mode.

Test modes B~D are proceeded for testing which circuitry (2T2C, 4T4C or 8T8C) is preferred to repair failed cell array blocks detected in a test mode A.

Figure 8A:
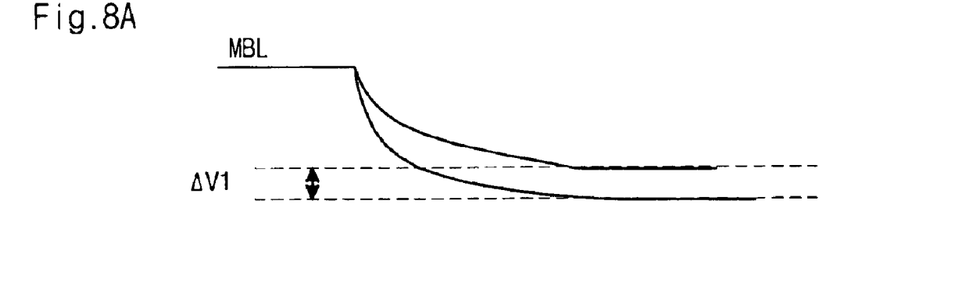
FIG. 8A to FIG. 8D are graphs showing a sensing voltage margin in each test mode.
Figure 8B:
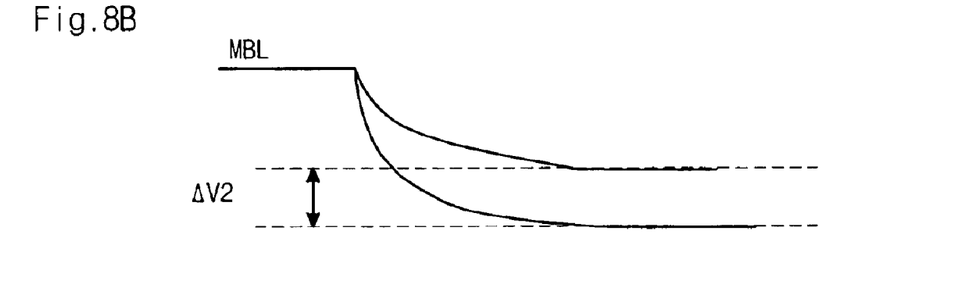
Figure 8C:
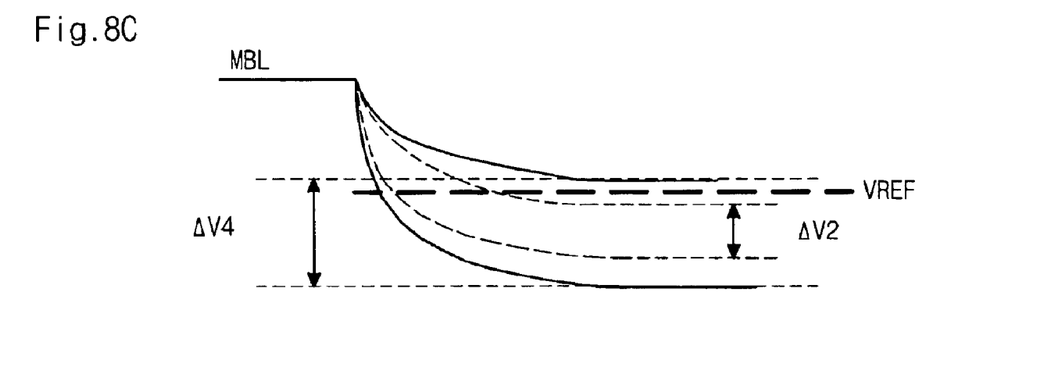
Figure 8D:
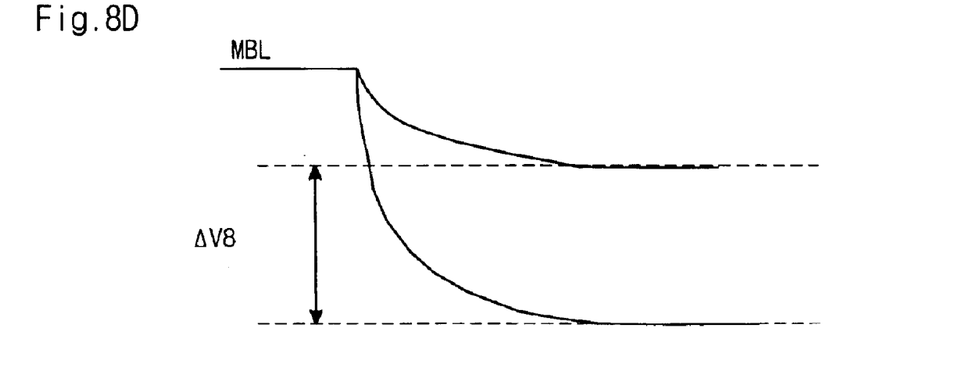

As shown in FIGS. 8A–8D, if the number of memory cell tested at the same time increases, the sensing voltage margin outputted to the common data buses BUS(0)~BUS(n) increases. Accordingly, since even memories which carry out abnormal operation in a 1T1C structure may carry out normal operation by driving more than 2T2C memory cells simultaneously, the memories are tested for repairing by changing the test modes. For example, as shown in FIG. 8C, since a reference voltage VREF is out of the sensing voltage margin $\Delta V2$ of a 2T2C structure, it is judged as fail. However, it is within the sensing voltage margin $\Delta V4$ of a 4T4C structure to be considered as being normal. Accordingly, when 4 cell array blocks BLK0~BLK3 are combined, even though the capacity of a memory device is reduced to ¼ of normal one, it can be used as a normal memory device.

FIGS. 9A–9D are block diagrams illustrating the configuration of cell array blocks in each test mode of the present invention.

Figure 9A:
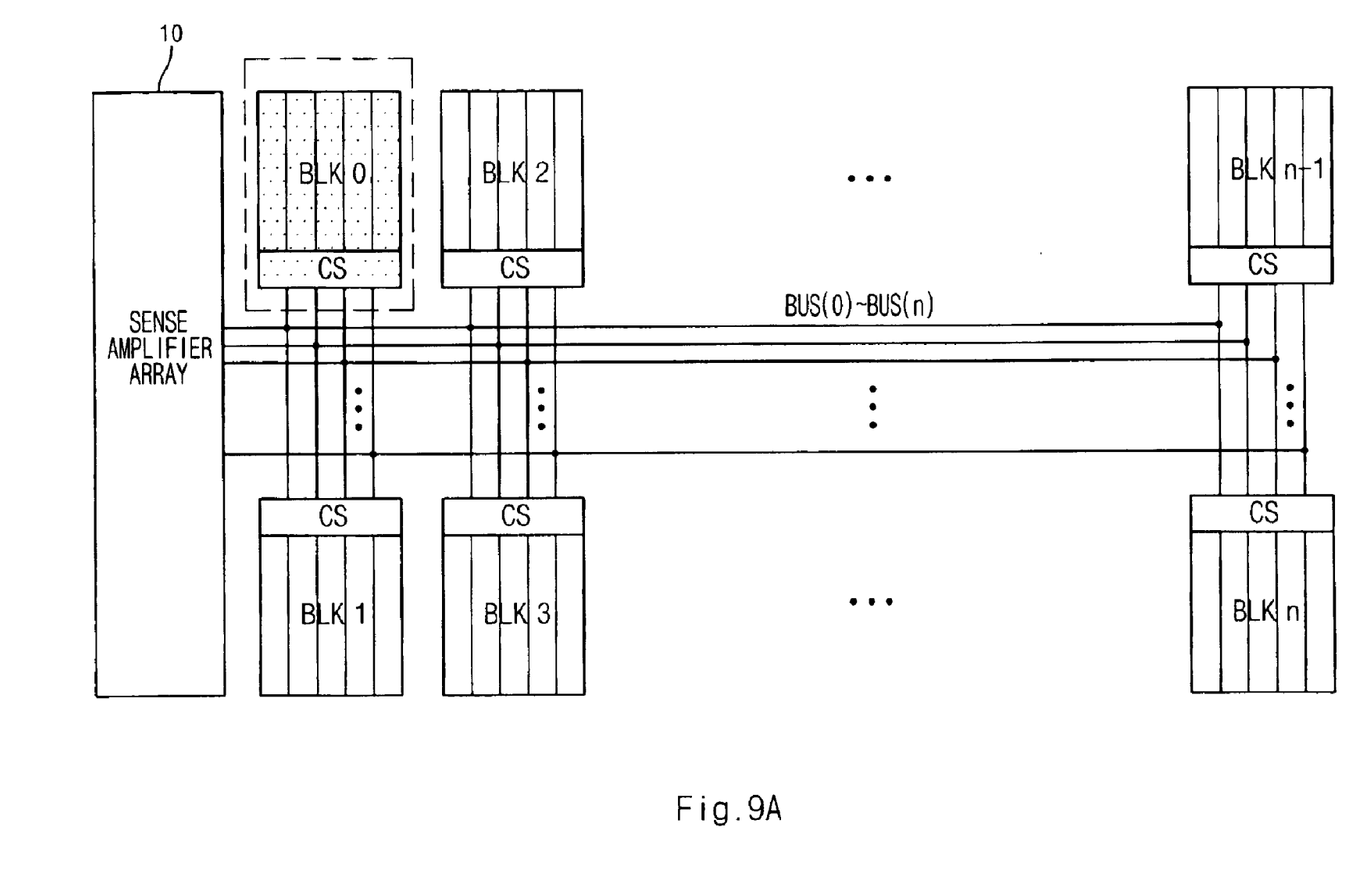
FIG. 9A to FIG. 9D are schematic views illustrating cell array blocks selected according to each test mode.
Figure 9B:
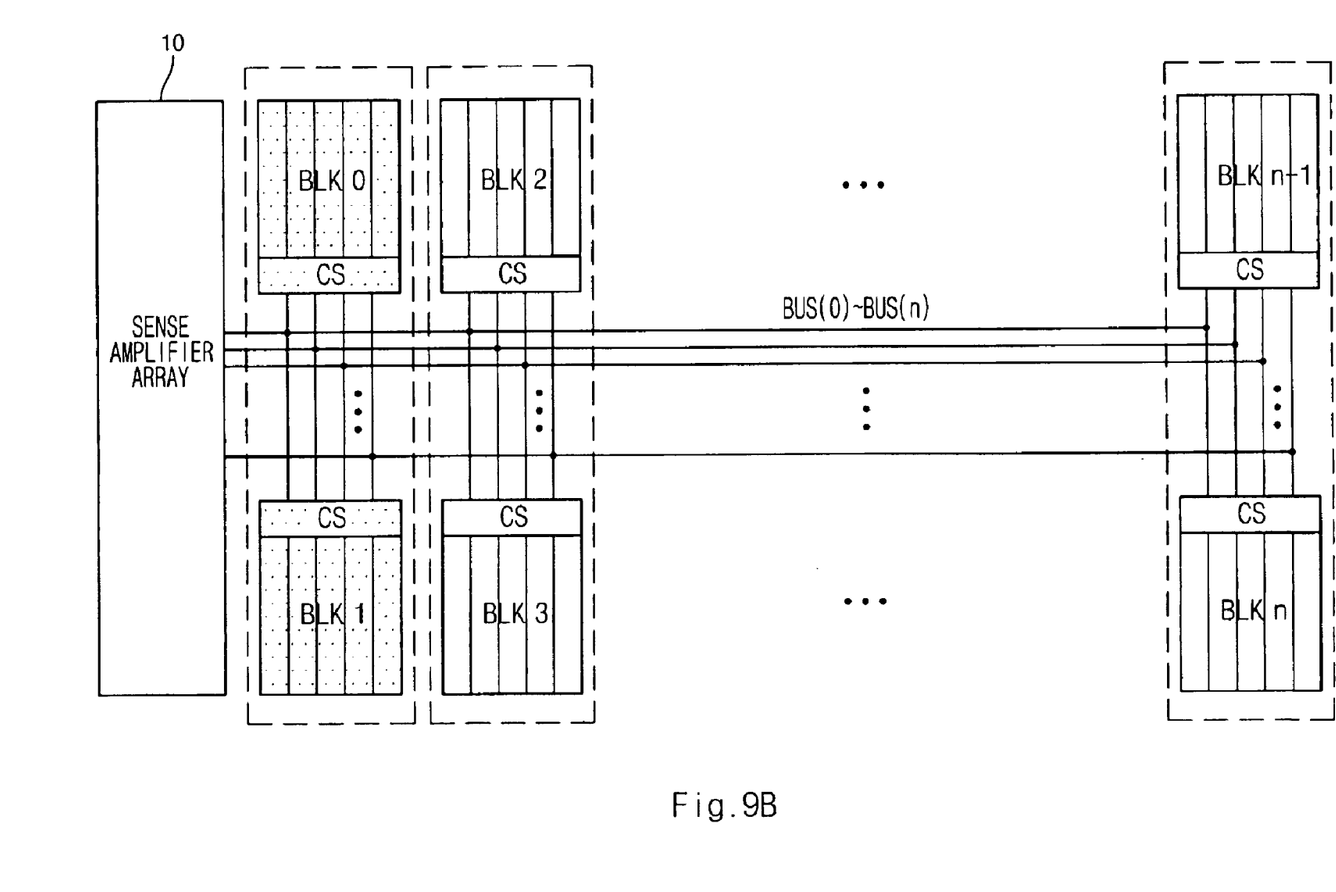

FIG. 9A illustrates an embodiment according to test mode A. First, in test mode A, a 1T1C test is carried out for each cell array block BLK0~BLKn to judge whether each cell array block BLK0~BLKn is failed.

The cell array selecting controller 32 outputs a block selecting signal BS which sequentially selects each cell array block BLK0~BLKn to the address decoder 34 when the test mode control signals TM1 and TM2 become '0' and '0', respectively. The address decoder 34 turns on column selecting units CS of corresponding cell array blocks for the whole cell array blocks BLK0~BLKn in response to the block selecting signal BS.

The test mode controller 22 outputs a mode selecting signal MS which notifies test mode A to the voltage controller 24 in response to the test mode control signals TM1 and TM2. The voltage controller 24 adjusts a reference voltage VREF supplied from a reference pad REFPAD to have the predetermined amplitude within the sensing voltage margin $\Delta V1$ as shown in FIG. 8a, and then outputs the adjusted reference voltage VREF to the sense amplifier array 10. Here, the sensing voltage margin $\Delta V1$ is determined by a normal memory cell, and may be somewhat different according to a tested nonvolatile ferroelectric memory device.

The sense amplifier array 10 detects whether a reference voltage VREF outputted from the voltage controller 24 is within the sense voltage margin $\Delta V1$ to judge fail of each cell array block BLK0~BLKn.

As a result of testing through test mode A, when a cell array block BLK0 is failed so that it is repaired, a test is carried out by 2T2C (test mode B) having a sensing voltage margin $\Delta V2$ larger than 1T1C as shown in FIG. 8B.

Accordingly, when the test mode control signals TM1 and TM2 become '0' and '1' respectively, the cell array selecting controller 32 a block selecting signal BS simultaneously selecting cell array blocks BLK0 and BLK1 outputs to the address decoder 34. The address decoder 34 turns on column selecting units CS of the cell array block BLK0 and BLK1 in response to the block selecting signal BS. The test mode controller 22 outputs a mode selecting signal MS notifying test mode B to the voltage controller 24 in response to the test mode control signals TM1 and TM2. The voltage controller 24 adjusts a reference voltage VREF supplied from a reference pad REFPAD to have the predetermined amplitude within the sensing voltage margin $\Delta V2$ as shown in FIG. 8B, and then outputs the adjusted reference voltage VREF to the sense amplifier array 10. The sense amplifier array 10 detects whether a reference voltage VREF outputted from the voltage controller 24 is within the sense voltage margin $\Delta V2$ to judge fail of two combined cell array blocks BLK0 and BLK1.

Figure 9C:
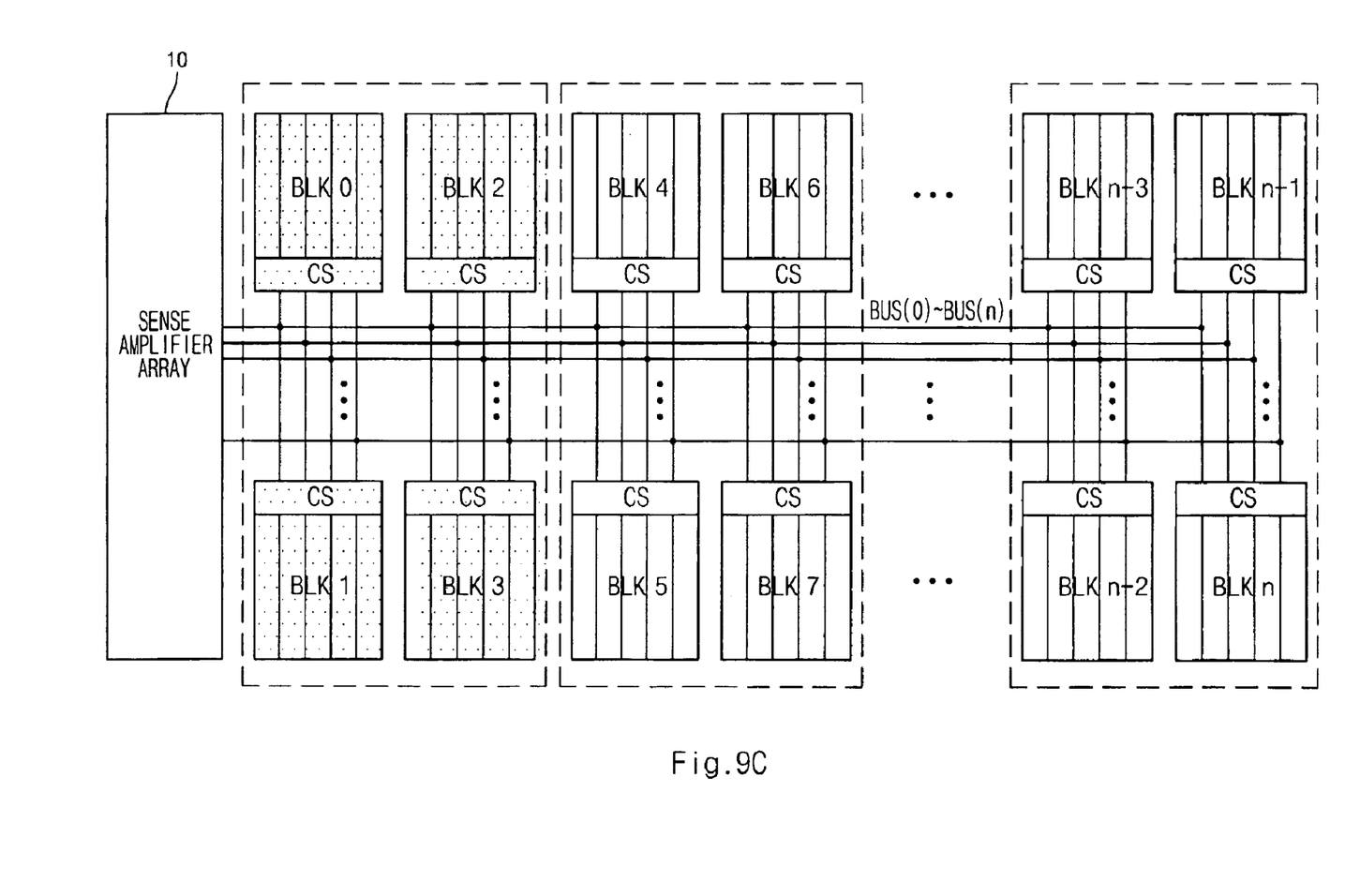
Figure 9D:
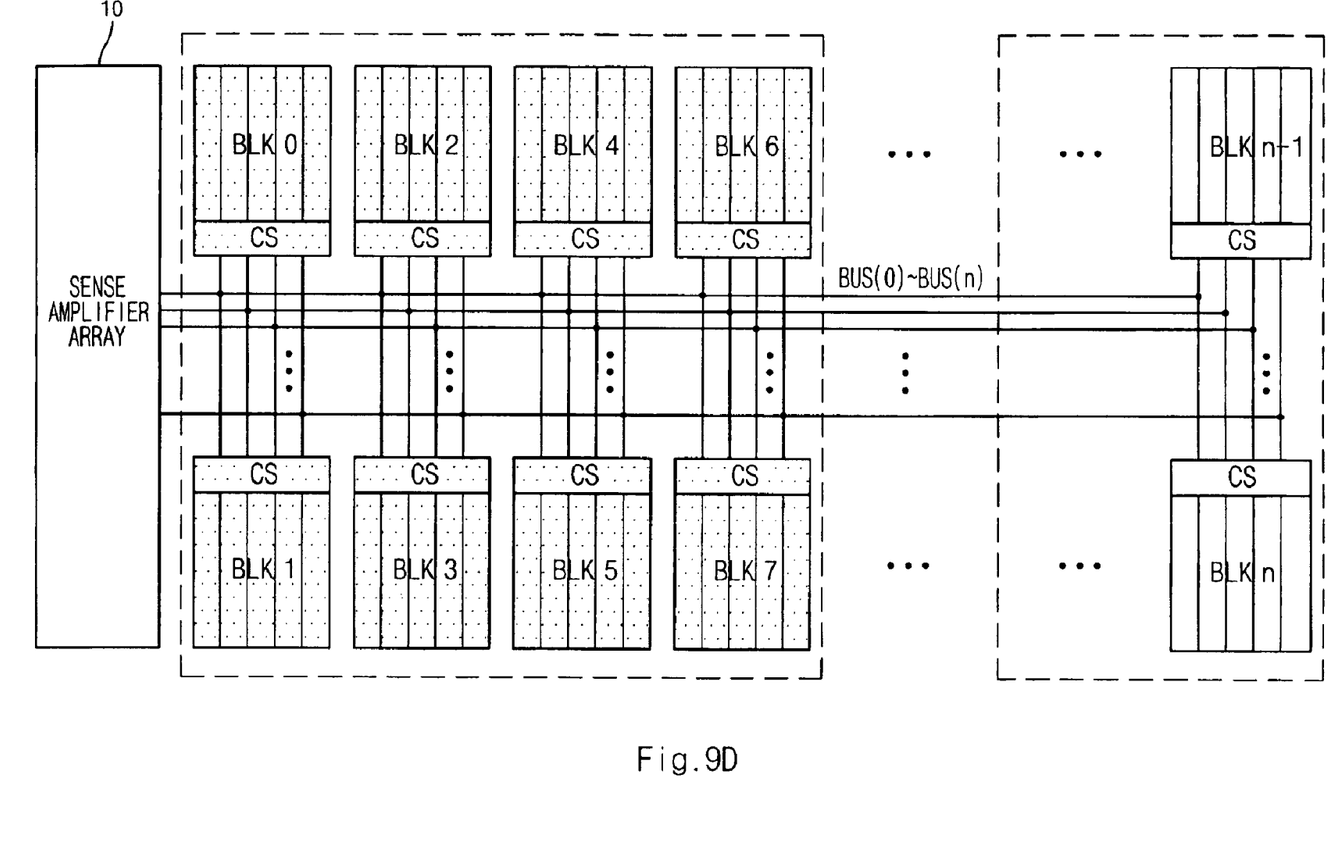

When a memory cell carries out a normal operation in test mode B, a test for the memory cell is ended. However, when a memory cell still carries out an abnormal operation in test mode B, a test is carried out with 4T4C (test mode C) having a sensing voltage margin $\Delta V4$ larger than 2T2C by combining four cell array blocks BLK0~BLK3 as shown in FIG. 9C. In the same manner, when a memory cell still carries out an abnormal operation in test mode C, a test is carried out with 8T8C (test mode D) having a sensing voltage margin $\Delta V8$ larger than 4T4C by combining eight cell array blocks BLK0~BLK7 as shown in FIG. 9D.

Methods for testing according to test modes C and D are to expand to two and four times the methods according to test modes B and C, respectively. Therefore, detailed description to methods according to test modes C and D is omitted herein.

In the embodiments described above, a test is carried out for maximum 8T8C by using the test mode control signals TM1 and TM2 of 2 bits, but the number of test mode control signals may be increased.

As shown above, the nonvolatile ferroelectric memory device according to an embodiment of the present invention having a test circuit for selectively testing more than 2 cell array blocks at the same time without modifying an internal circuit by using test signals, thereby reducing the expense and time for test.

What is claimed is:

1. A nonvolatile ferroelectric memory device comprising:
   a plurality of cell array blocks including a plurality of cell arrays having a multi-bitline structure which comprises a plurality of sub bitlines selectively connected to a main bitline and converts a sensing voltage of the sub bitlines to electric current to induce a sensing voltage in the main bitline;
   a plurality of common data buses for transmitting a sensing voltage of data stored in the cell array blocks, being shared by the plurality of cell array blocks;
   a sense amplifier array having a plurality of sense amplifiers for comparing the sensing voltage transmitted through the common data buses with a reference voltage;
   a reference voltage controller for adjusting the reference voltage in response to test mode control signals externally applied thereto; and
   a column selecting controller for selecting a predetermined number of the cell array blocks in response to the test mode control signals, and outputting sensing voltages of the selected cell array blocks to the common data buses at the same time.

2. The device according to claim 1, wherein the column selecting controller connects the main bitlines of $2^n$ (n is a positive number) cell array blocks symmetrically located around the central common data buses among the plurality of cell array blocks to the common data buses.

3. The device according to claim 1, wherein the column selecting controller comprises:
   a block selecting controller for generating a block selecting signal which selects the cell array blocks simultaneously connected to the common data buses in response to the test mode control signals; and
   an address decoder for generating column selecting signals which connect the main bitlines of the selected cell array blocks to the common data buses in response to the block selecting signal.

4. The device according to claim 1, wherein the reference voltage controller comprises:
   a test mode controller for generating a mode selecting signal in response to the test mode control signals; and
   a voltage controller for controlling the amplitude of a reference voltage externally applied thereto in response to the mode selecting signal.

5. A method for testing cell array blocks by sensing sensing voltages of a plurality of cell array blocks having a multi-bitline structure which converts sensing voltages of sub bitlines to electric current to induce sensing voltages of main bitlines through common data buses, comprising steps of:
   a first test for comparing a sensing voltage of each of the cell array blocks with a reference voltage to judge whether fail is occurred; and
   a second test, when a cell array block is failed in the first test, for selecting the failed cell array block and at least one normal cell array block at the same time, and then comparing a transmitted sensing voltage with the reference voltage to judge whether fail is occurred.

6. The method according to claim 5, wherein the first test is performed for judging fail when the reference voltage is not within the sensing voltage margin of one of the cell array blocks.

7. The method according to claim 5, wherein the second test step is performed for selecting $2^n$ (n is a positive number) cell array blocks including the failed cell array blocks at the same time and then compares transmitted sensing voltage with the reference voltage to judge whether fail is occurred.

8. The method according to claim 7, wherein the second test is performed for judging fail when the reference voltage is not within the sensing voltage margin of a predetermined number of the cell array blocks simultaneously selected.

9. The method according to claim 5, wherein the reference voltage is adjusted to be within the sensing voltage margin of the predetermined number of the cell array blocks simultaneously selected.

* * * * *

UNITED STATES PATENT AND TRADEMARK OFFICE
CERTIFICATE OF CORRECTION

PATENT NO. : 6,922,352 B2
DATED : July 26, 2005
INVENTOR(S) : Jeong

It is certified that error appears in the above-identified patent and that said Letters Patent is hereby corrected as shown below:

<u>Title page,</u>
Item [75], Inventors, should read -- Dong Yun Jeong, Chungcheongbuk (KR) --.

Signed and Sealed this

Sixteenth Day of May, 2006

JON W. DUDAS
*Director of the United States Patent and Trademark Office*